US007952190B2

(12) United States Patent
Emery

(10) Patent No.: US 7,952,190 B2
(45) Date of Patent: May 31, 2011

(54) FABRICATION OF MICROELECTRONIC DEVICES

(75) Inventor: Richard D. Emery, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 554 days.

(21) Appl. No.: 10/608,718

(22) Filed: Jun. 27, 2003

(65) Prior Publication Data

US 2004/0262748 A1 Dec. 30, 2004

(51) Int. Cl.
*H01L 23/34* (2006.01)
(52) U.S. Cl. ............... 257/712; 257/778; 257/E33.075; 257/E31.131; 257/E23.051
(58) Field of Classification Search ............ 257/778, 257/737–738, 712, 747, 748, 718, 719, E33.075, 257/E31.131, E23.051, 779, 704, 706, 720
See application file for complete search history.

(56) References Cited

U.S. PATENT DOCUMENTS

| 4,415,025 | A | * | 11/1983 | Horvath | 165/185 |
| 5,663,596 | A | * | 9/1997 | Little | 257/727 |
| 6,081,037 | A | * | 6/2000 | Lee et al. | 257/778 |
| 6,787,899 | B2 | * | 9/2004 | Rinella et al. | 257/712 |
| 2002/0171144 | A1 | * | 11/2002 | Zhang et al. | 257/738 |
| 2002/0185728 | A1 | * | 12/2002 | Turner | 257/718 |
| 2004/0052054 | A1 | * | 3/2004 | Huang et al. | 361/719 |

* cited by examiner

*Primary Examiner* — A. Sefer
*Assistant Examiner* — Dilinh P Nguyen
(74) *Attorney, Agent, or Firm* — Blakely, Sokoloff, Taylor & Zafman

(57) ABSTRACT

A method and apparatus for fabrication of microelectronic devices are shown. In an embodiment of the invention, a microelectronic device comprises a die, the die comprising a first side, a second side, and an edge; a first plate, the first plate coupled with the die; and a package, the die being coupled with the package.

7 Claims, 5 Drawing Sheets

FABRICATION OF MICROELECTRONIC DEVICES

FIELD

An embodiment of the invention relates to microelectronic devices in general, and more specifically to fabrication of microelectronic devices to affect expansion characteristics.

BACKGROUND

In the manufacture of microelectronic devices, a die may be created and affixed to a package to form a device. However, the die and the other parts of the package may have differing characteristics. One important difference relates to the coefficient of thermal expansion (CTE), which is a value that expresses how a material expands or contracts as temperatures change.

If a die has a different CTE than the package and therefore expands at a different rate than the package, there is a risk of mechanical failure, including mechanical failure of interconnects between the die and the package. Reliable connection of a die to a package is difficult, and CTE mismatch between the die and package can complicate fabrication of microelectronic devices. With the use of low K (dielectric constant) ILD (inter-layer dielectric) materials on die in device construction, the risk of failure for microelectronic devices may increase.

BRIEF DESCRIPTION OF THE DRAWINGS

The invention may be best understood by referring to the following description and accompanying drawings that are used to illustrate embodiments of the invention. In the drawings.

DETAILED DESCRIPTION

Figure 1:
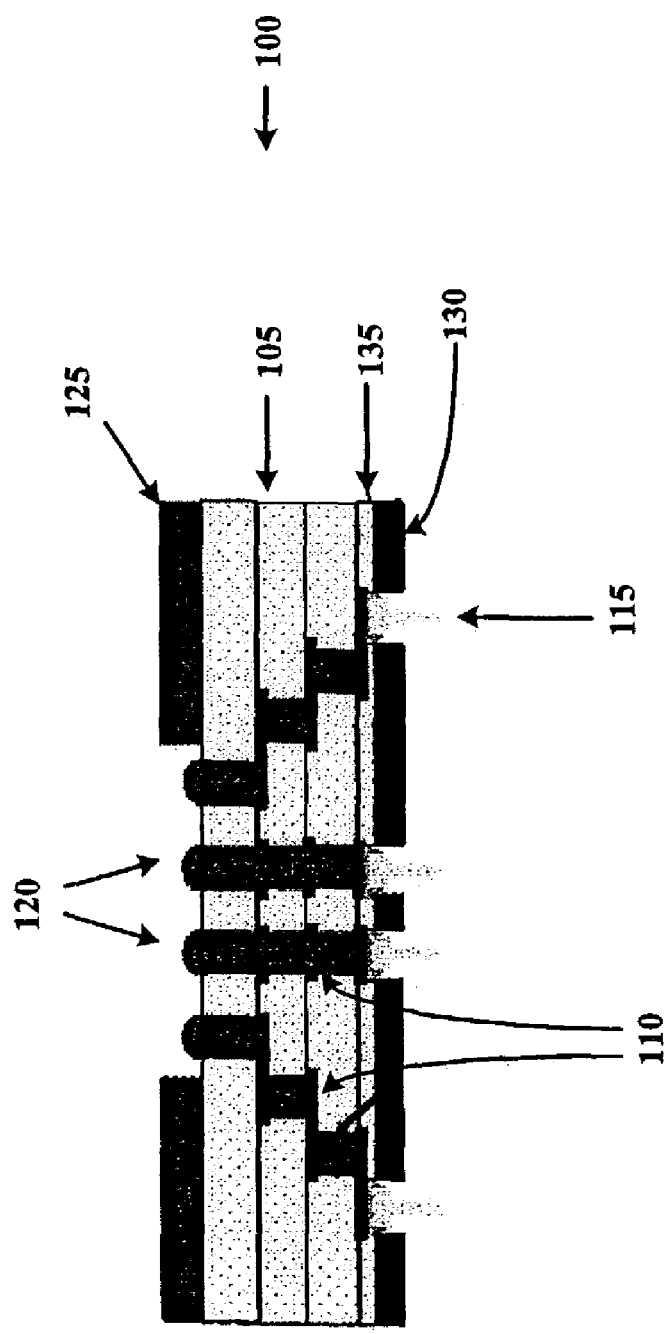
FIG. 1 illustrates an embodiment of a package.

A method and apparatus are described for microelectronic package fabrication.

Terminology

Before describing an exemplary environment in which various embodiments of the present invention may be implemented, some terms that will be used throughout this application will briefly be defined:

As used herein, "die" or means an unpackaged microelectronic device.

As used herein, "package" means a component to wholly or partially contain a die. The package generally provides electrical connections for a die.

As used herein, "microelectronic device" means a device including a die in a package.

As used herein, "CTE" or "coefficient of thermal expansion" means a measure of contraction or expansion of a material or device as a function of temperature change.

According to an embodiment of the invention, a microelectronic device that comprises a package and a die is fabricated such that the package exerts forces on the die to cause it to expand and contract with the package. The device is constructed such that the apparent CTE of the die more closely matches to the CTE of the package.

According to an embodiment of the invention, a die is bonded or coupled with a stiffener or other plate or surface, referred to herein as a "plate". The plate may be of any shape that allows expansion and contraction with temperature changes. The plate expands and contracts with temperature, and thus places physical stress on the die that is attached to it. The use of the plate modifies the apparent or effective CTE of the die, i.e., modifying the rate of change in size of the die as a function of temperature. According to an embodiment of the invention, the apparent CTE of a die is modified to more closely match the CTE of a package for the die.

The coupling or bonding of a die with a plate or stiffener varies according to the particular embodiment. The die may be attached by any method that allows the plate to impart physical force to the die as the temperature of the plate changes and the plate expands or contracts.

In one embodiment of the invention, a die is attached, bonded, or otherwise coupled at the edges of the die with a surrounding plate. In this embodiment, the plate includes a hole or cavity constructed to allow insertion of the die. The die may be inserted into the plate and one or more edges of the die may be coupled with the plate. In one example, the plate includes a hole that is shaped similarly to the shape of the die. The die is inserted into this hole and one or more edges of the die are coupled with the plate. According to an embodiment of the invention, the die is placed into the plate at a relatively higher temperature. When the plate and die cool, the plate may contract around the die, ensuring a tight fit and good mechanical coupling between the die and the plate.

In another embodiment of the invention, a side of a die is coupled with a plate. The side attached to the die may be an inactive side of the die, a side that does not include electronic connections or traces. The plate may act as an integrated heat spreader. According to the embodiment, one side of the plate is attached, bonded, or otherwise coupled with a side of the die. The coupling of the plate and the die allows for physical attachment of all or a part of one side of the die with the plate.

The method of coupling a die with a plate will vary with the embodiment of the invention. In one example, an edge or a side of a die is bonded to the plate using a bonding material that provides a strong seal as the plate and die expand and contract with temperature. The bonding material may include, but is not limited to, a stiff solder material or adhesive. Other methods may also be used to couple the die with the plate.

According to an embodiment of the invention, a plate is constructed of a material that modifies the apparent CTE of a die. The apparent CTE of a die may be modified to more closely match the CTE of the package. The material used in constructing the plate will vary according the embodiment. According to one embodiment of the invention, the plate comprises copper or a copper alloy, but other materials may be utilized in conjunction with an embodiment of the invention. The plate coupled with the package may be of any shape that allows expansion and contraction with temperature changes. The plate expands and contracts with temperature, and thus places physical stress on the package.

According to an embodiment of the invention, a die that is coupled with a plate is coupled with the package. In addition to any other coupling, the die is coupled to provide electrical connection with the package, which then provides connection with electrical contacts. In one example, a package may comprise a plurality of solder bumps or similar contacts, and the die is coupled with the solder bumps or contacts.

According to an embodiment of the invention, a package may include a second plate. In one example, the plate is coupled with the package on a different side of the package than the side used for coupling the die with the package. The plate may be chosen to affect the CTE of the package. In one embodiment, the CTE of the plate coupled with the package is similar to the CTE of the plate coupled with the die. In a particular example, the plate coupled with the package is constructed of the same material as the plate coupled with the die.

The method of coupling a package with a plate will vary with the embodiment of the invention. In one example, a side of a package is bonded to the plate using a bonding material that provides a strong seal as the plate and die expand and contract with temperature. The bonding material may include, but is not limited to, a stiff solder material or adhesive. Other methods may also be used to couple the package with the plate.

The figures presented here illustrate a particular package structure for use with a die. However, embodiments of the invention are not limited to this particular package structure. Embodiments of the invention are usable in any environment in which a die is utilized with a package to form a microelectronic device.

FIG. 1 is an illustration of a package that may be utilized in conjunction with an embodiment of the invention. The package 100 comprises a package body 105, through which there is a plurality of vias 110. At a first end, the vias connect to solder bumps 120, which may comprise Sn/Ag (tin/silver) solder, to provide a connection to a die. The vias 110 fan out to connect to conductors 115, which are spread more widely than the solder bumps 120 to allow a more usable pitch for connections to a board, mounting device, or other connection. The package 100 may include one or more plates for use in modifying CTE factors to more closely match the apparent CTE of the die with the CTE of the package. The plates may be referred to as "stiffeners". In one embodiment, a first plate 125 may surround the solder bumps 120 around an area to be used for installation of a die into the package 100. A second plate 130 may be coupled on the opposite side of the package 100. The second plate is shown attached to the package 100 by an adhesive 135.

Figure 2:
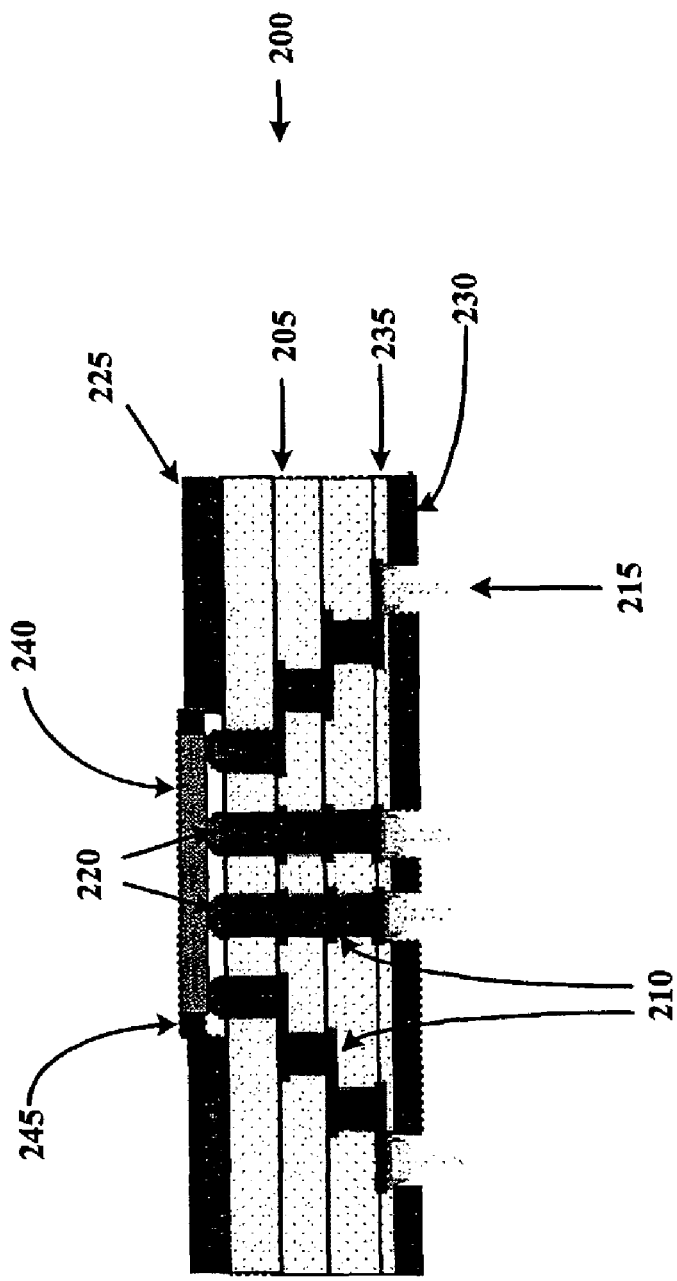
FIG. 2 illustrates an embodiment of a die placed in a package.

FIG. 2 is an illustration of a package and die according to an embodiment of the invention. The package 200 comprises a package body 205, through which there is a plurality of vias 210. At a first end, the vias connect to solder bumps 220 to provide a connection to a die 240. The vias 210 fan out to connect to conductors 215. A die 240 is connected to the solder bumps. In this illustration, a plate is present on either side of the package. The first plate 225 surrounds the die 240. For example, the first plate 225 may comprise a hole for the placement of a die. The first plate 225 is coupled with the die 240 at one or more edges of the die by material, such as a stiff solder, that provides a secure physical connection to the first plate 225. In one embodiment, the die 240 is constructed to be more thin than usual in order to allow for construction in the device and to allow for thermal expansion of the die. For example, the die 240 may be a thickness of approximately 250 µm, as opposed to a standard thickness of approximately 700 µm. A second plate 230 is coupled with the package 200 on the opposite side. The second plate 230 is shown attached to the package 200 by an adhesive 235, although other methods of coupling the second plate to the package may be used. In one embodiment, the second plate 330 is approximately 150 µm thick.

As illustrated by FIG. 2, the first plate 225 modifies the apparent CTE of the die 235 to more closely match the CTE of the package 200. As temperature increase and the first plate 235 expands, the die 235 is forced to expand by forces pulling on the die 235 at the points of attachment between the die 235 and the first plate 225 on edges of the die 235. The package is coupled with the second plate 230 by the adhesive 230 and the connection to the second plate 230 modifies the CTE of the package. With the effect of the first plate 225 and the second plate 230, the apparent CTE of the die 235 may be designed to more closely match the CTE of the package 200, which may reduce the potential for mechanical failure of connections and other issues related to mismatch of CTE for a microelectronic device.

Figure 3:
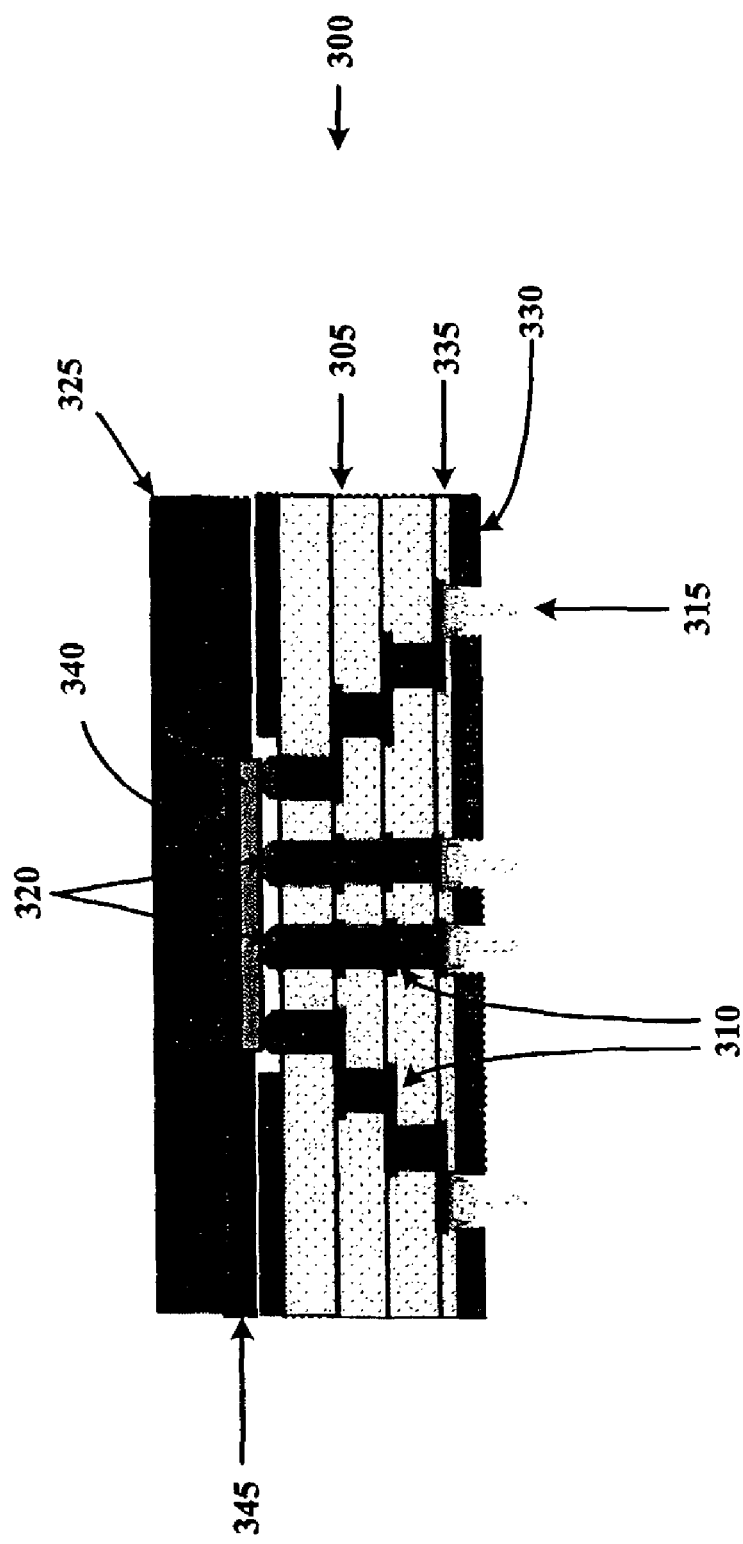
FIG. 3 illustrates an embodiment of a die placed in a package and covered by an integrated heat spreader.

FIG. 3 is an illustration of a package and die according to an embodiment of the invention. The package 300 comprises a package body 305, through which there is a plurality of vias 310. At a first end, the vias connect to solder bumps 320 to provide a connection to a die. The vias 310 fan out to connect to conductors 315. A die 340 is connected to the solder bumps. The package 300 comprises a plate on either side of the package. A first plate 325 is coupled with the die 340. The first plate 325 is coupled with one side of the die (the inactive side of the die) by a material providing a strong connection to the die, such as a stiff solder. The first plate 325 acts as an integrated heat spreader for the device. In one embodiment, the die 340 is constructed to be more thin than usual in order to allow for construction of the microelectronic device and to allow for thermal expansion of the die 340. For example, the die 340 may be a thickness of approximately 50 µm, as opposed to a standard thickness of approximately 700 µm. In this embodiment, the first plate 325 can be thicker than the die 340. A second plate 330 may be attached to the package on the opposite side. The second plate 330 is shown attached to the package 300 by an adhesive 335, although other methods of coupling the plate to the package 300 may be used. The thickness of the second plate 330 will vary according to the embodiment. In one embodiment, the second plate 330 is approximately 150 µm thick.

As illustrated by FIG. 3, the first plate 325 modifies the apparent CTE of the die 335 to more closely match the CTE of the package 300. As temperature increase and the first plate 335 expands, the die 335 is forced to expand by forces pulling on the die 335 at the points of attachment between the die 335 and the first plate 325 on the inactive side of the die 335.

In FIGS. 2 and 3, a first plate and a second plate are constructed of materials chosen to match the apparent CTE of a die to the CTE of a package. In one embodiment, the first plate and the second plate are constructed of the same material. The material used to construct the first plate and the second plate will vary according to the embodiment, including but not limited to copper.

Figure 4:
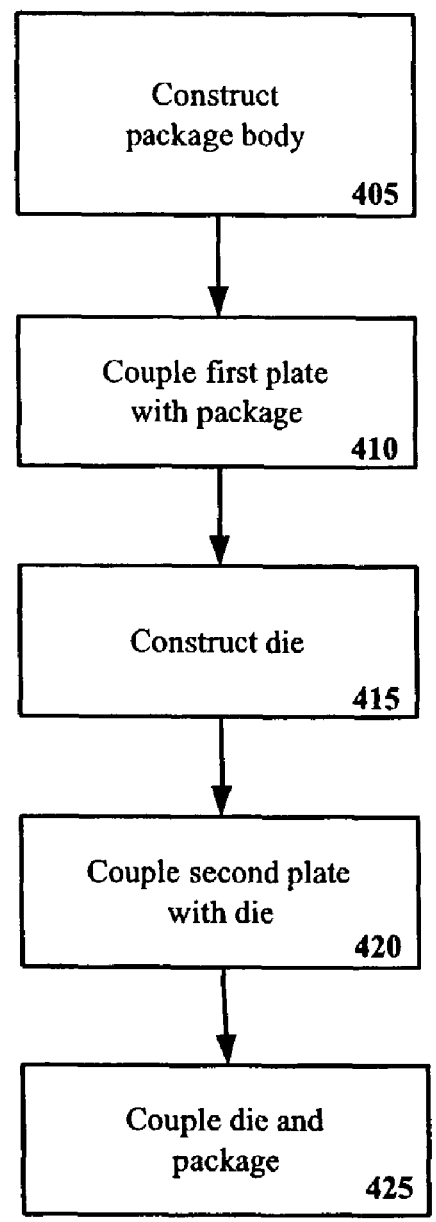
FIG. 4 is a flow chart illustrating an embodiment of the invention.

FIG. 4 is a flowchart illustrating an embodiment of the invention. The order of the tasks presented in FIG. 4 may vary according to the embodiment and the fabrication process used. According to the embodiment, a package body is constructed 405. The construction of the package body may include coupling a first plate with the package body 410. A die is constructed 415. The die is coupled with a second plate 420. In one example, the second plate is coupled to the edges of the die with an appropriate material, such as with a stiff solder. In another example, the second plate is coupled with one side of the die. The first plate and the second plate are constructed of materials that will cause the apparent CTE of the die to more closely match the CTE of the package. In one embodiment, the first plate and the second plate are constructed of copper.

Alternative Embodiments

Figure 5:
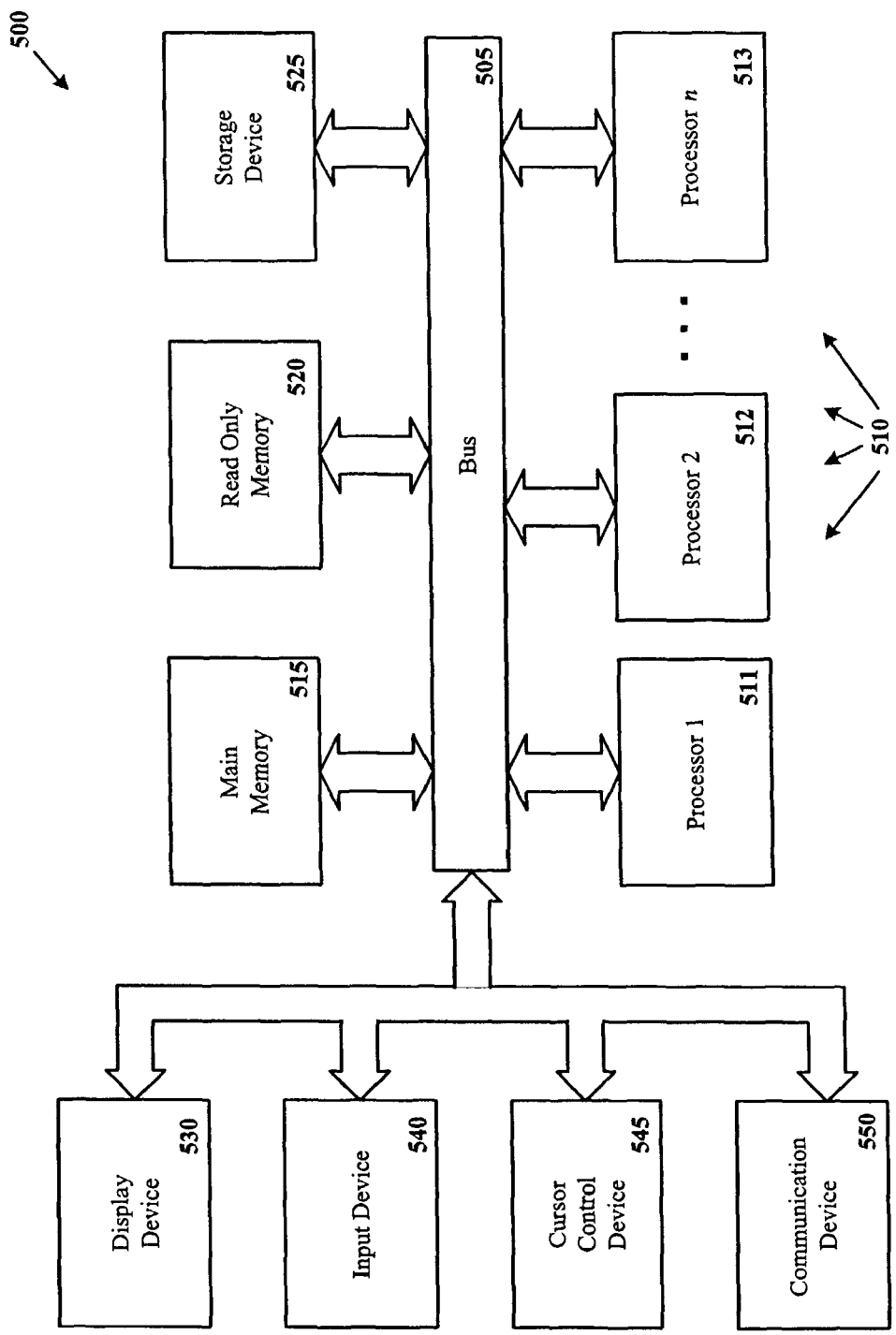
FIG. 5 is a schematic representation of an embodiment of a computer.

Techniques described here may be used in many different environments. FIG. 5 is block diagram of an exemplary computer that can be used in conjunction with an embodiment of the invention. The computer includes one or more microelectronic devices that comprise an embodiment of the invention. Under an embodiment of the invention, a computer 500 comprises a first bus 505 or other communication means for communicating information, and a processing means such as one or more processors 510 (shown as 511, 512 and continuing through 513) coupled with the bus 505 for processing information. One or more of the processors may comprise an embodiment of the invention.

The computer 500 further comprises a random access memory (RAM) or other dynamic storage device as a main memory 515 for storing information and instructions to be executed by the processors 510. Main memory 515 also may be used for storing temporary variables or other intermediate information during execution of instructions by the processors 510. The computer 500 also may comprise a read only memory (ROM) 520 and/or other static storage device for storing static information and instructions for the processor 510. One or more memory devices may comprise an embodiment of the invention.

A data storage device 525 may also be coupled to the first bus 505 of the computer 500 for storing information and instructions. The data storage device 525 may include a magnetic disk or optical disc and its corresponding drive, flash memory or other nonvolatile memory, or other memory device. Such elements may be combined together or may be separate components, and utilize parts of other elements of the computer 500.

The computer 500 may also be coupled via the bus 505 to a display device 530, such as a liquid crystal display (LCD) or other display technology, for displaying information to an end user. In some environments, the display device may be a touch-screen that is also utilized as at least a part of an input device. In some environments, display device 530 may be or may include an auditory device, such as a speaker for providing auditory information. An input device 540 may be coupled to the bus 505 for communicating information and/or command selections to the processor 510. In various implementations, input device 540 may be a keyboard, a keypad, a touch-screen and stylus, a voice-activated system, or other input device, or combinations of such devices. Another type of user input device that may be included is a cursor control device 545, such as a mouse, a trackball, or cursor direction keys for communicating direction information and command selections to processor 510 and for controlling cursor movement on display device 530.

A communication device 550 may also be coupled to the bus 505. Depending upon the particular implementation, the communication device 550 may include a transceiver, a wireless modem, a network interface card, or other interface device. The computer 500 may be linked to a network or to other devices using the communication device 550, which may include links to the Internet, a local area network, or another environment.

General Matters

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps. The steps of the present invention may be performed by hardware components or may be embodied in machine-executable instructions, which may be used to cause a general-purpose or special-purpose processor or logic circuits programmed with the instructions to perform the steps. Alternatively, the steps may be performed by a combination of hardware and software.

Portions of the present invention may be provided as a computer program product, which may include a machine-readable medium having stored thereon instructions, which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Many of the methods are described in their most basic form, but steps can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A microelectronic device comprising:
   a die, the die comprising a first side, a second side, and an edge;
   a first plate, the first plate coupled with the die, the first plate comprising a hole, the die fitting within the hole, the edge of the die being coupled with an edge of the first plate by the hole, the edge of the die being soldered with the edge of the first plate; and
   a package, the die being coupled with the package.

2. The microelectronic device of claim 1, wherein the first plate exerts forces on the die to modify its effective coefficient of thermal expansion.

3. The microelectronic device of claim 2, where the first plate modifies the coefficient of thermal expansion of the die to make the coefficient of thermal expansion of die more closely match the coefficient of thermal expansion of the package.

4. The microelectronic device of claim 1, further comprising a second plate coupled with the package.

5. The microelectronic device of claim 4, wherein the package is attached with the second plate by an adhesive.

6. The microelectronic device of claim 5, wherein the first plate and second plate are constructed of the same material.

7. The microelectronic device of claim 6, wherein the first plate and the second plate are constructed of copper.

* * * * *